United States Patent
Xu et al.

(10) Patent No.: US 11,543,455 B2
(45) Date of Patent: Jan. 3, 2023

(54) CIRCUIT MEASURING DEVICE AND METHOD

(71) Applicant: ANPEC ELECTRONICS CORPORATION, Hsinchu (TW)

(72) Inventors: Chuang-Shun Xu, Hsinchu (TW); Ming-Hung Chang, Hsinchu (TW); Wen-Yen Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 90 days.

(21) Appl. No.: 17/205,613

(22) Filed: Mar. 18, 2021

(65) Prior Publication Data
US 2022/0170984 A1 Jun. 2, 2022

(30) Foreign Application Priority Data
Nov. 27, 2020 (TW) ................................. 109141737

(51) Int. Cl.
*G01R 31/319* (2006.01)
*G01R 31/26* (2020.01)
*G09G 3/00* (2006.01)

(52) U.S. Cl.
CPC ... *G01R 31/3191* (2013.01); *G01R 31/31905* (2013.01); *G01R 31/31924* (2013.01); *G01R 31/2635* (2013.01); *G09G 3/006* (2013.01)

(58) Field of Classification Search
CPC .......... G01R 31/2635; G01R 31/31905; G01R 31/3191; G01R 31/31924; G09G 3/006
See application file for complete search history.

(56) References Cited

U.S. PATENT DOCUMENTS

| | | | |
|---|---|---|---|
| 6,597,195 B1* | 7/2003 | Beaudry | G01J 1/08 324/750.05 |
| 8,593,148 B2* | 11/2013 | Morrow | G01R 31/26 324/414 |
| 8,836,797 B1* | 9/2014 | Rykowski | G09G 3/20 345/589 |
| 9,161,414 B2* | 10/2015 | Brancken | H05B 45/58 |
| 9,311,847 B2* | 4/2016 | Hall | G09F 13/22 |
| 9,544,970 B2* | 1/2017 | Dunser | H05B 45/00 |
| 11,119,154 B1* | 9/2021 | De Cicco | G01R 31/3187 |

* cited by examiner

*Primary Examiner* — Vinh P Nguyen
(74) *Attorney, Agent, or Firm* — Li & Cai Intellectual Property (USA) Office

(57) ABSTRACT

A circuit measuring device and a method thereof are provided. A voltage source supplies a common voltage such that a calibration current having a preset current value flows from a current-voltage converter to a final test machine. The current-voltage converter converts the calibration current into a calibration voltage. At this time, a voltage sensing component senses a voltage between an input terminal and an output terminal of the current-voltage converter to output sensed calibration data. The current-voltage converter converts a tested current outputted by a tested circuit into a tested voltage. At this time, the voltage sensing component senses the voltage between the input terminal and the output terminal of the current-voltage converter to output actual sensed data. When the final test machine determines that a difference between the sensed calibration data and the actual sensed data is larger than a threshold, the tested circuit is adjusted.

14 Claims, 8 Drawing Sheets

CIRCUIT MEASURING DEVICE AND METHOD

CROSS-REFERENCE TO RELATED PATENT APPLICATION

This application claims the benefit of priority to Taiwan Patent Application No. 109141737, filed on Nov. 27, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a circuit, and more particularly to a circuit measuring device and method for measuring light-emitting diodes of a display device.

BACKGROUND OF THE DISCLOSURE

With the continuous advancement of backlight technologies, liquid crystal display devices have been continuously developed. Light-emitting diodes (LED) have excellent performances and long lifetimes and thus have been widely used in various fields. For example, the light-emitting diodes are used as backlight sources of the liquid crystal display devices. However, in a terminal test process of the liquid crystal display device, a conventional measuring device cannot immediately receive sufficient input power and thus requires a long time for measuring the liquid crystal display device and generating a measured result. Furthermore, the measured result may contain an error.

SUMMARY OF THE DISCLOSURE

In response to the above-referenced technical inadequacies, the present disclosure provides a circuit measuring device. The circuit measuring device includes a final test machine and one or more current sensing circuits. The final test machine is configured to provide a voltage source for supplying a common voltage in a calibration mode and a measurement mode. The final test machine is configured to provide a current source in the calibration mode. The current sensing circuits are connected to the final test machine. Each of the current sensing circuits includes a current-voltage converter and a voltage sensing circuit. The current-voltage converter is connected to the current source in the calibration mode and connected to a tested circuit in the measurement mode. The current-voltage converter is connected to the voltage source and configured to receive the common voltage from the voltage source in the calibration mode and the measurement mode. As a result, a calibration current having a preset current value flows from the current-voltage converter to the final test machine as an output current of the current source in the calibration mode. The current-voltage converter converts the calibration current into a calibration voltage in the calibration mode. The current-voltage converter receives a tested current from the tested circuit and converts the tested current into a tested voltage in the measurement mode. The voltage sensing circuit is connected to the current-voltage converter. The voltage sensing circuit is configured to sense a voltage between an input terminal of the current-voltage converter and an output terminal of the current-voltage converter to output sensed calibration data in the calibration mode. The voltage sensing circuit is configured to sense the voltage between the input terminal of the current-voltage converter and the output terminal of the current-voltage converter to output actual sensed data in the measurement mode. In the measurement mode, the final test machine is configured to calculate a difference between the sensed calibration data and the actual sensed data. In the measurement mode, when the final test machine determines that the difference is higher than a difference threshold, the final test machine outputs an adjusting signal for instructing the tested circuit to adjust the tested current.

In certain embodiments, the number of the current sensing circuits is more than one. Each of the current sensing circuits includes the current-voltage converter and the voltage sensing circuit. The current sensing circuits are respectively configured to convert a plurality of tested currents outputted by the tested circuit into a plurality of tested voltages in the measurement mode.

In certain embodiments, the final test machine provides a switching circuit connected to the current sensing circuits. In the calibration mode, the switching circuit sequentially switches the current sensing circuits such that the current sensing circuits are sequentially connected to the final test machine, and allows a plurality of calibration currents that are respectively outputted by the current sensing circuits flow to the final test machine respectively during different time intervals.

In certain embodiments, the switching circuit includes a multiplexer.

In certain embodiments, the calibration current outputted by the current-voltage converter includes a first calibration current and a second calibration current. When the current-voltage converter converts the first calibration current into a first calibration voltage and outputs the first calibration voltage, the voltage sensing circuit generates first sensed calibration data according to the voltage between the input terminal and the output terminal of the current-voltage converter. When the current-voltage converter converts the second calibration current into a second calibration voltage and outputs the second calibration voltage, the voltage sensing circuit generates second sensed calibration data according to the voltage between the input terminal and the output terminal of the current-voltage converter. In the calibration mode, the final test machine is configured to generate a calibration equation according to the first calibration current, the first sensed calibration data, the second calibration current and the second sensed calibration data. In the calibration mode, the final test machine is configured to calculate the sensed calibration data when the current sensing circuit receives the calibration current having a target current value based on calibration equation. In the measurement mode, the final test machine is configured to compare the sensed calibration data with the actual sensed data to determine whether the tested circuit outputs the tested current having the target current value.

In certain embodiments, the calibration equation is represented by:

$$DX = \alpha \times IX + \beta,$$

in which DX represents the sensed calibration data, IX represents the calibration current having the target current value, α represents a gain, and β represents an offset value.

In certain embodiments, the final test machine is configured to generate a first sensed calibration equation according to the first calibration current and the first sensed calibration data. The final test machine is configured to generate a second sensed calibration equation according to the second calibration current and the second sensed calibration data. The final test machine is configured to perform an arithmetic operation on the first sensed calibration equation and the second sensed calibration equation to generate the calibration equation.

In certain embodiments, the first sensed calibration equation is represented by: $D0=\alpha \times I0+\beta$, wherein D0 represents the first sensed calibration data generated when each of current-voltage converters CV1 to CVn outputs the first calibration current, α represents the gain, β represents the offset value, and I0 represents the first calibration current. The second sensed calibration equation is represented by: $D1=\alpha \times I1+\beta$, wherein D1 represents the second sensed calibration data generated when each of the current-voltage converters CV1 to CVn outputs the second calibration current, α represents the gain, β represents the offset value, and I1 represents the second calibration current. The calibration equation is represented by: $DX=\alpha \times IX+\beta$, wherein DX represents the sensed calibration data, IX represents the calibration current having the target current value, α represents the gain, and β represents the offset value.

In addition, the present disclosure provides a circuit measuring method, including the following steps: in a calibration mode, supplying a common voltage; in the calibration mode, generating a calibration current having a preset current value; in the calibration mode, converting the calibration current into a calibration voltage; in the calibration mode, sensing the calibration voltage to output sensed calibration data; in a measurement mode, supplying the common voltage; in the measurement mode, converting a tested current from a tested circuit into a tested voltage; in the measurement mode, sensing the tested voltage to output actual sensed data; in the measurement mode, calculating a difference between the sensed calibration data and the actual sensed data; and in the measurement mode, determining whether or not the difference between the sensed calibration data and the actual sensed data is higher than a difference threshold, in response to determining that the difference is higher than the difference threshold, outputting an adjusting signal for instructing the tested circuit to adjust the tested current, in response to determining that the difference is not higher than the difference threshold, outputting a test ending signal.

In certain embodiments, the circuit measuring method further includes the following steps: in the measurement mode, converting a plurality of tested currents outputted by the tested circuit into a plurality of tested voltages; and in the measurement mode, sensing the tested voltages to output the actual sensed data.

In certain embodiments, the circuit measuring method further includes the following steps: in the calibration mode, receiving the common voltage and generating a first calibration current according to the common voltage; in the calibration mode, converting the first calibration current into a first calibration voltage; in the calibration mode, sensing the first calibration voltage to output first sensed calibration data; in the calibration mode, receiving the common voltage and generating a second calibration current according to the common voltage; in the calibration mode, converting the second calibration current into a second calibration voltage; in the calibration mode, sensing the second calibration voltage to output second sensed calibration data; in the calibration mode, generating a calibration equation according to the first calibration current, the first sensed calibration data, the second calibration current and the second sensed calibration data; in the calibration mode, calculating the sensed calibration data when the calibration current having a target current value is generated, based on the calibration equation; and in the measurement mode, comparing the sensed calibration data with the actual sensed data to determine whether or not the tested circuit outputs the tested current having the target current value, in response to determining that the tested circuit outputs the tested current having the target current value, outputting the test ending signal, in response to determining that the tested circuit does not output the tested current having the target current value, outputting the adjusting signal.

In certain embodiments, the circuit measuring method further includes the following step: in the calibration mode, generating the calibration equation according to the first calibration current, the first sensed calibration data, the second calibration current, the second sensed calibration data, a gain and an offset value, wherein the calibration equation is represented by:

$$DX=\alpha \times IX+\beta,$$

wherein, DX represents the sensed calibration data, IX represents the calibration current having the target current value, α represents the gain, and β represents the offset value.

In certain embodiments, the circuit measuring method further includes the following steps: in the calibration mode, generating a first sensed calibration equation according to the first calibration current and the first sensed calibration data; in the calibration mode, generating a second sensed calibration equation according to the second calibration current and the second sensed calibration data; and in the calibration mode, performing an arithmetic operation on the first sensed calibration equation and the second sensed calibration equation to generate the calibration equation.

In certain embodiments, the circuit measuring method further includes the following steps: in the calibration mode, based on the first calibration current and the first sensed calibration data, generating the first sensed calibration equation represented by:

$$D0=\alpha \times I0+\beta,$$

wherein D0 represents the first sensed calibration data generated when each of current-voltage converters CV1 to CVn outputs the first calibration current, α represents the gain, β represents the offset value, and I0 represents the first calibration current;

in the calibration mode, based on the second calibration current and the second sensed calibration data, generating the second sensed calibration equation represented by:

$$D1=\alpha \times I1+\beta,$$

wherein D1 represents the second sensed calibration data generated when each of the current-voltage converters CV1 to CVn outputs the second calibration current, α represents the gain, β represents the offset value, and I1 represents the second calibration current; and in the calibration mode, performing the arithmetic operation on the first sensed calibration equation and the second sensed calibration equation to generate the calibration equation represented by:

$$DX=\alpha \times IX+\beta,$$

wherein DX represents the sensed calibration data, IX represents the calibration current having the target current value, α represents the gain, and β represents the offset value.

As described above, the present disclosure provides the circuit measuring device and method, which have the following advantages:

1. the current sensing circuits synchronously test the tested circuit, thereby effectively reducing a time required for measuring the tested circuit;
2. the current sensing circuits are disposed such that hardware equipment requirements of the final test machine are reduced, for example, a large number of voltage sources and current sources do not need to be disposed; and
3. the circuit measuring device accurately determines whether or not the tested current outputted by the tested circuit is equal to the target current, the tested circuit being adjusted when the tested current is not equal to the target current.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following description and accompanying drawings, in which.

DETAILED DESCRIPTION OF THE EXEMPLARY EMBODIMENTS

Figure 1:
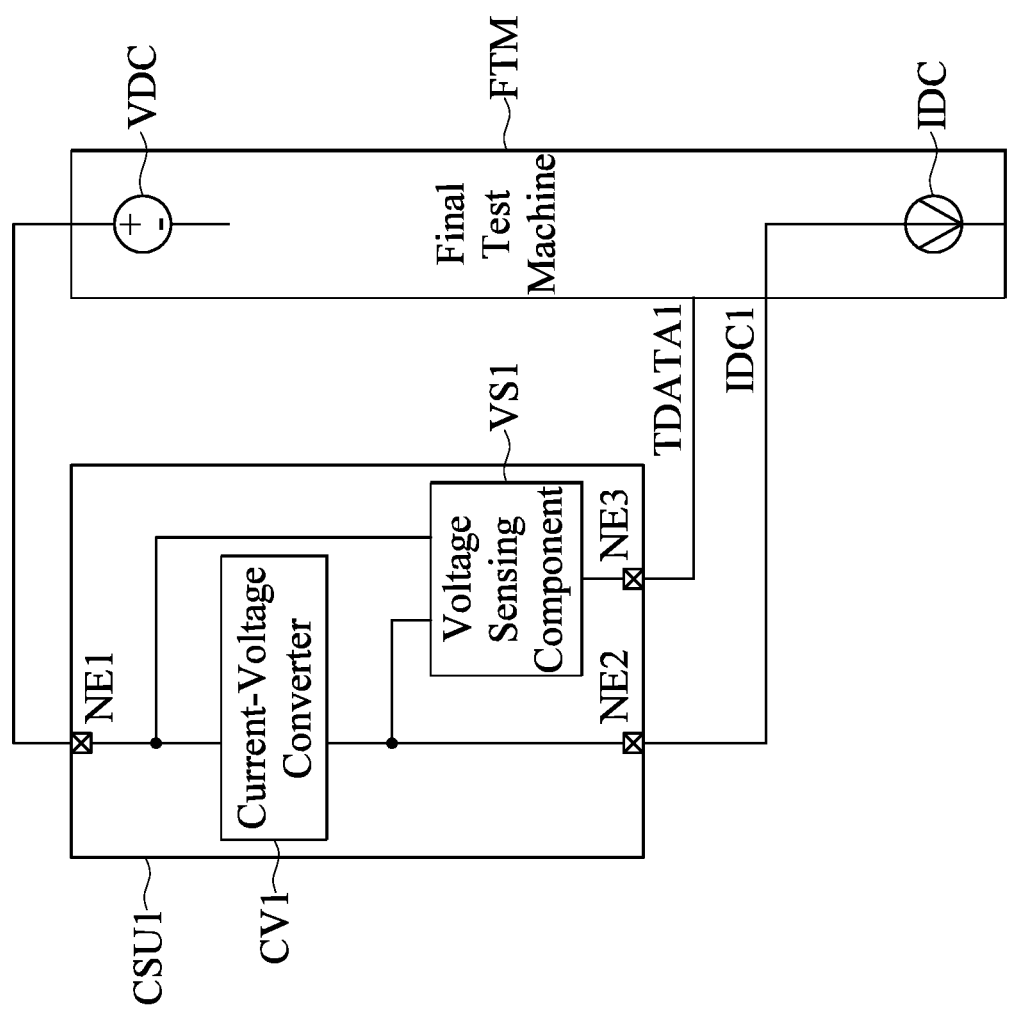
FIG. 1 is a circuit layout diagram of a circuit measuring device in a calibration mode according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
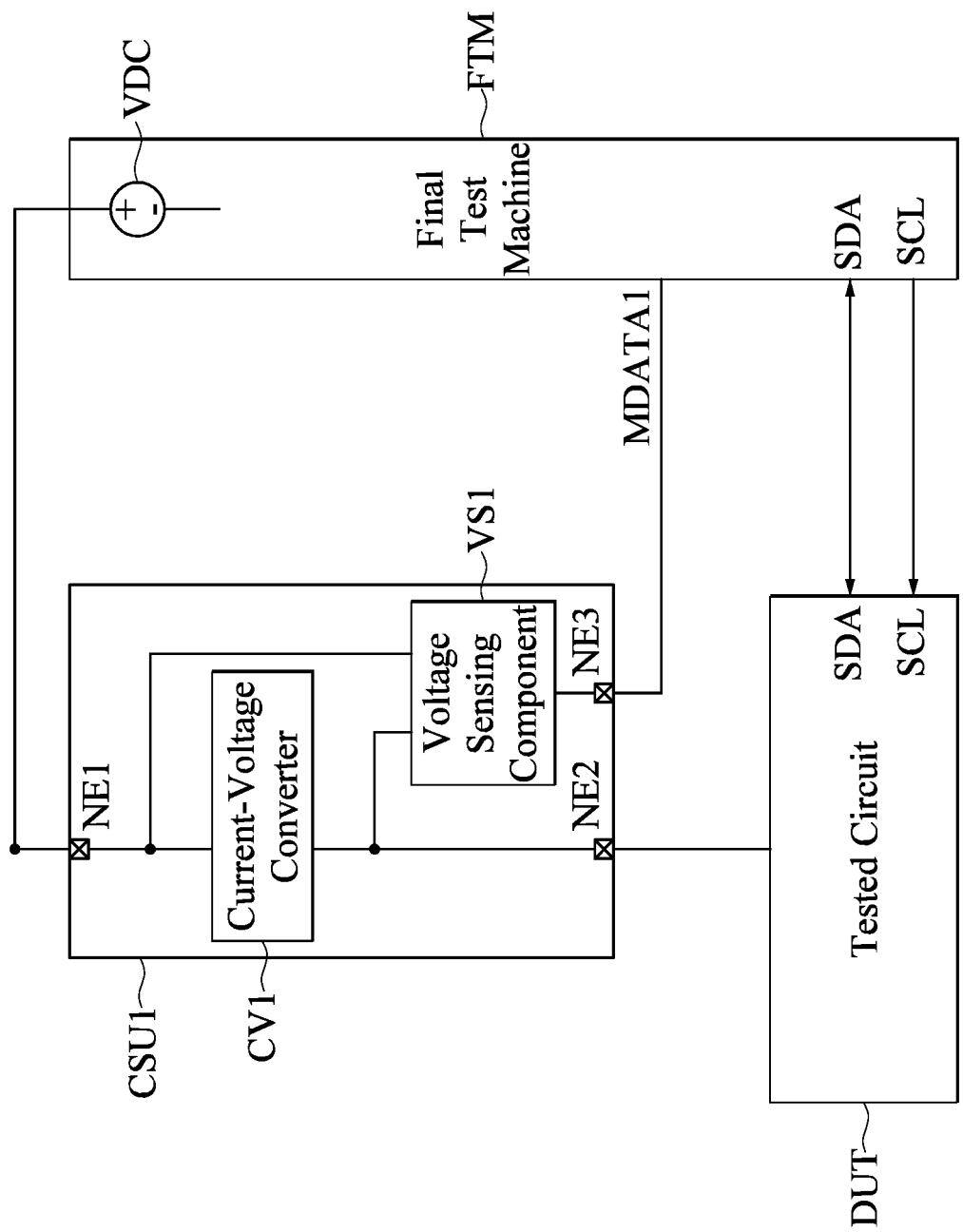
FIG. 2 is a circuit layout diagram of the circuit measuring device in a measurement mode according to the first embodiment of the present disclosure.

Reference is made to FIGS. 1 and 2, wherein FIG. 1 is a circuit layout diagram of a circuit measuring device in a calibration mode according to a first embodiment of the present disclosure, and FIG. 2 is a circuit layout diagram of the circuit measuring device in a measurement mode according to the first embodiment of the present disclosure.

As shown in FIGS. 1 and 2, in the embodiment, the circuit measuring device can include a final test machine FTM and a current sensing circuit CSU1. The current sensing circuit CSU1 can include a current-voltage converter CV1 and a voltage sensing component VS1.

An error exists between actual data and data sensed by any commercially available voltage sensing component such as the voltage sensing component VS1. Therefore, the circuit measuring device needs to perform the calibration processes.

As shown in FIG. 1, in the calibration mode, the final test machine FTM provides a voltage source VDC. The voltage source VDC is connected to a first node NE1 of the current sensing circuit CSU1. An input terminal of the current sensing circuit CSU1 is connected to the first node NE1 of the current sensing circuit CSU1, and is connected to the voltage source VDC through the first node NE1.

In the calibration mode, an output terminal of the current-voltage converter CV1 is connected to a second node NE2 of the current sensing circuit CSU1, and is connected to a current source IDC provided by the final test machine FTM through the second node NE2. In the calibration mode, the voltage source VDC of the final test machine FTM provides a common voltage to the current-voltage converter CV1 of the current sensing circuit CSU1. As a result, a calibration current IDC1 having a preset current value flows from the current-voltage converter CV1 of the current sensing circuit CSU1 to the final test machine FTM.

In the calibration mode, the voltage sensing component VS1 is connected to an input terminal and the output terminal of the current-voltage converter CV1. An output terminal of the voltage sensing component VS1 is connected to a third node NE3 of the current sensing circuit CSU1, and is connected to the final test machine FTM through the third node NE3.

In the calibration mode, the voltage sensing component VS1 senses a voltage between the input terminal and the output terminal of the current-voltage converter CV1 to output sensed calibration data TDATA1 to the final test machine FTM. In detail, the voltage sensing component VS1 senses a first voltage of the input terminal of the current-voltage converter CV1 and a second voltage of the output terminal of the current-voltage converter CV1, and then calculates a difference between the first voltage and the second voltage to output the sensed calibration data TDATA1.

When the calibration mode is performed and the calibration current IDC1 having the preset current value flows from the current-voltage converter CV1 to the final test machine FTM, the current-voltage converter CV1 senses the sensed calibration data TDATA1. Then, the circuit measuring device performs measurement processes on a tested circuit DUT, such as light-emitting diodes of a display device, the measurement processes are described specifically as follows.

As shown in FIG. 2, in the measurement mode, the final test machine FTM provides the voltage source VDC. The voltage source VDC is connected to the first node NE1 of the current sensing circuit CSU1. A first terminal of the current-voltage converter CV1 is connected to the first node NE1 of the current sensing circuit CSU1, and is connected to the voltage source VDC through the first node NE1.

It is worth noting that, in the measurement mode, a second terminal of the current-voltage converter CV1 is connected to the tested circuit DUT through the second node NE2 of the current sensing circuit CSU1. Pins SCL and SDA of the final test machine FTM may output a clock signal for triggering the tested circuit DUT to output a current as a tested current. The second terminal of the current-voltage converter CV1 receives the tested current from the tested circuit DUT and then converts the tested current into a tested voltage. The first terminal of the current-voltage converter CV1 outputs the tested voltage.

In the measurement mode, the voltage sensing component VS1 is connected to the first terminal and the second terminal of the current-voltage converter CV1. The output terminal of the voltage sensing component VS1 is connected to the third node NE3 of the current sensing circuit CSU1, and is connected to the final test machine FTM through the third node NE3.

In the measurement mode, the voltage sensing component VS1 senses the voltage between the first terminal and the second terminal (that are respectively the output terminal and the input terminal) of the current-voltage converter CV1 to output actual sensed data MDATA1 to the final test machine FTM.

Finally, in the measurement mode, the final test machine FTM calculates a voltage difference between the sensed calibration data TDATA1 and the actual sensed data MDATA1. When the final test machine FTM determines that the voltage difference is larger than a difference threshold such as zero, the pins SCL and SDA of the final test machine FTM output an adjusting signal to the tested circuit DUT to instruct the tested circuit DUT to adjust the tested current. When the voltage difference between the sensed calibration data TDATA1 and the actual sensed data MDATA1 is smaller than the difference threshold, the tested current outputted by the tested circuit DUT does not need to be adjusted.

Figure 3:
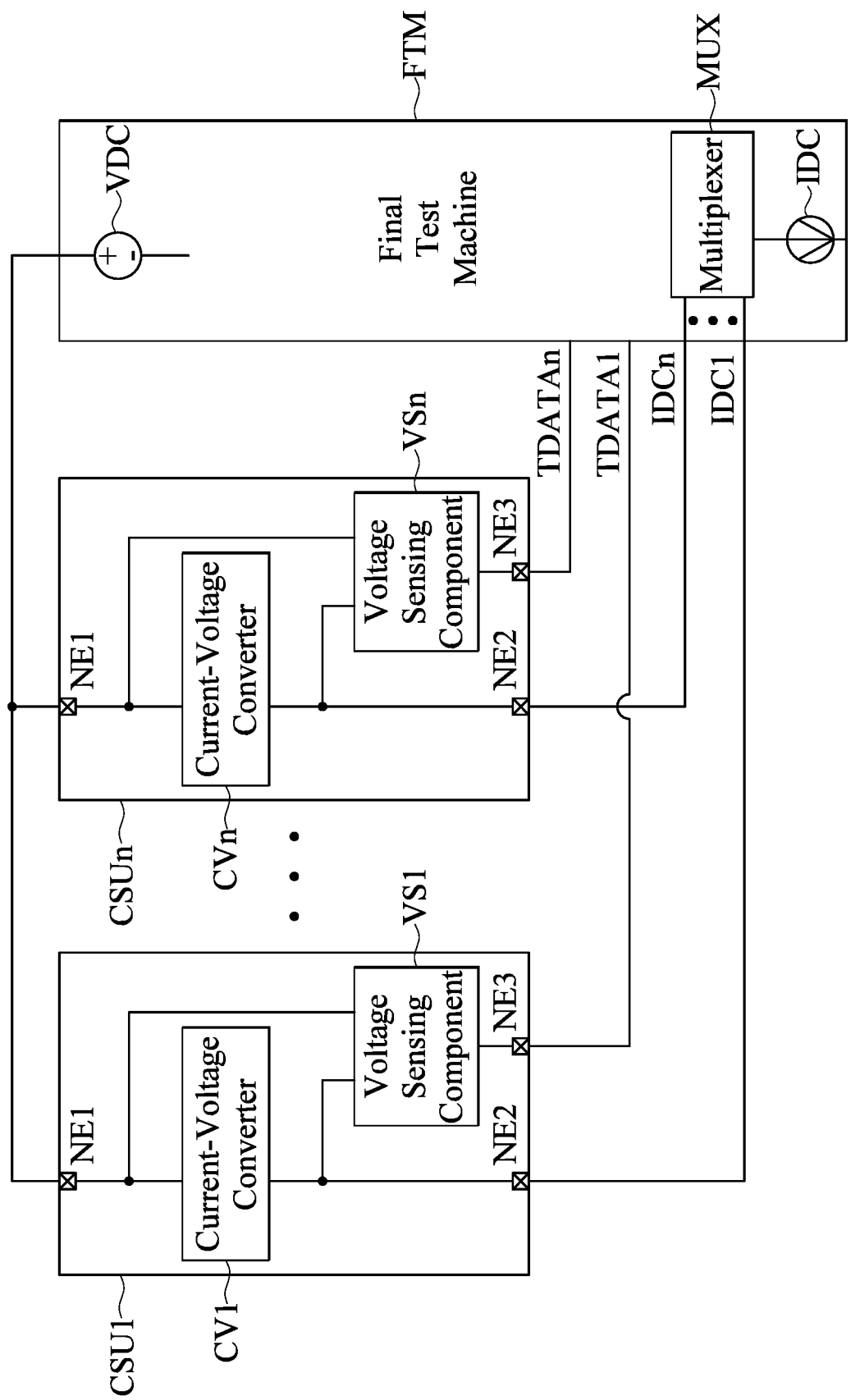
FIG. 3 is a circuit layout diagram of a circuit measuring device in a calibration mode according to a second embodiment of the present disclosure.
Figure 4:
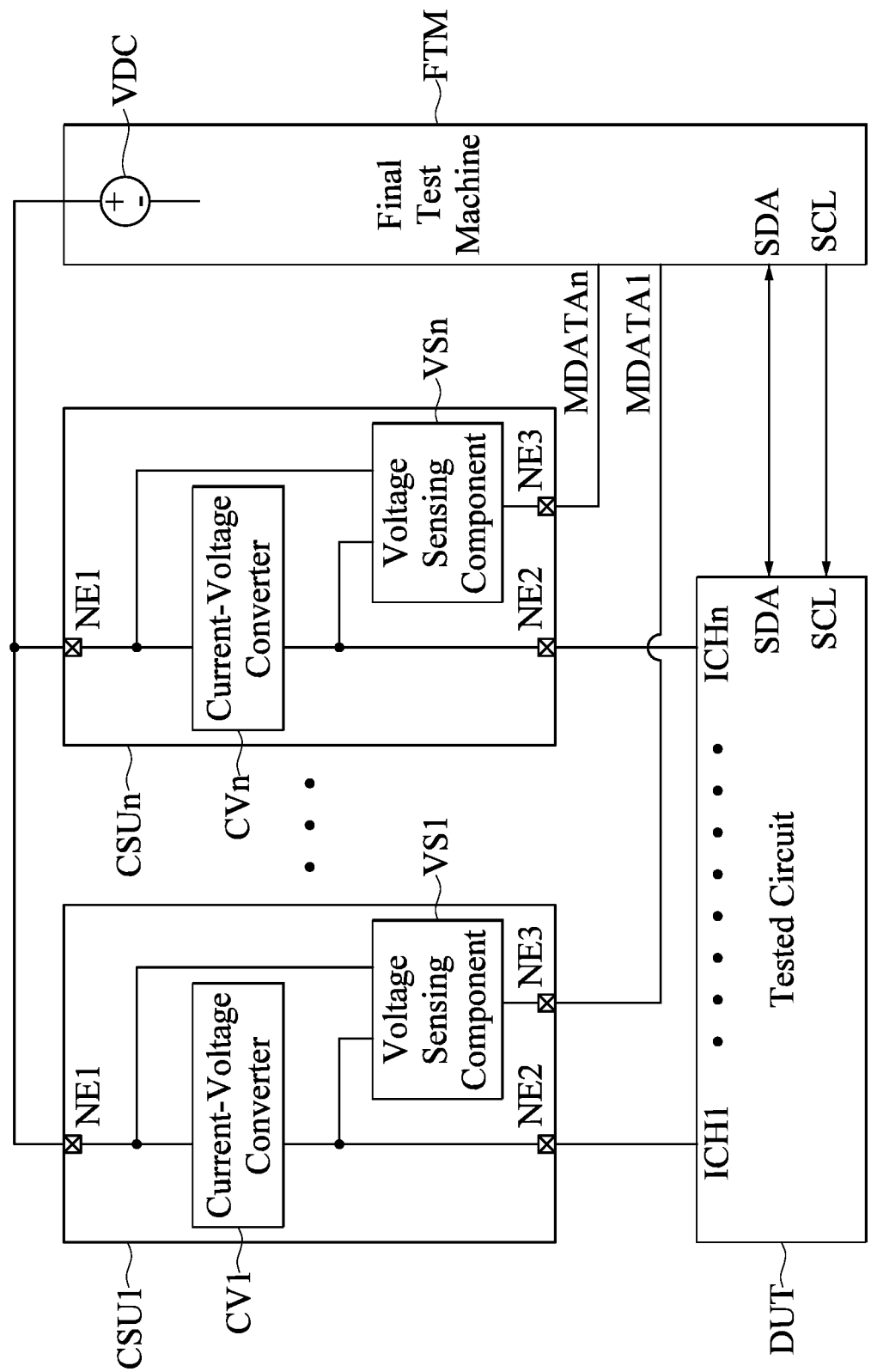
FIG. 4 is a circuit layout diagram of the circuit measuring device in a measurement mode according to the second embodiment of the present disclosure.

Reference is made to FIGS. 3 and 4, wherein FIG. 3 is a circuit layout diagram of a circuit measuring device in a calibration mode according to a second embodiment of the present disclosure, and FIG. 4 is a circuit layout diagram of the circuit measuring device in a measurement mode according to the second embodiment of the present disclosure.

A difference between FIG. 3 and FIG. 2 is that, only one current sensing circuit that is the current sensing circuit CSU1 is disposed in the circuit measuring device as shown in FIG. 2, but a plurality of current sensing circuits CSU1 to CSUn are disposed in the circuit measuring device as shown in FIG. 3. The current sensing circuits CSU1 to CSUn are configured so as to sense more currents at the same time. The number of the current sensing circuits CSU1 to CSUn is n, which may be any suitable integer value larger than 1.

The circuit measuring device shown in FIG. 3 performs the calibration mode, which is described specifically as follows.

As shown in FIG. 3, in the calibration mode, the final test machine FTM provides the voltage source VDC. The voltage source VDC is connected to the first node NE1 of each of the current sensing circuits CSU1 to CSUn. Input terminals of current-voltage converters CV1 to CVn are respectively connected to the first nodes NE1 of the current sensing circuits CSU1 to CSUn, and connected to the voltage source VDC respectively through the first nodes NE1.

It is worth noting that, a difference exists between actual data and data sensed by each of the current sensing circuits CSU1 to CSUn. The differences of the current sensing circuits CSU1 to CSUn are different, which is caused by different characteristics of the current sensing circuits CSU1 to CSUn or other factors. Therefore, the calibration processes need to be performed respectively on each of the current sensing circuits CSU1 to CSUn.

In order to perform the calibration processes on the current sensing circuits CSU1 to CSUn, the second nodes NE2 of the current sensing circuits CSU1 to CSUn are connected to the final test machine FTM through a multiplexer MUX. In practice, the multiplexer MUX may be replaced with other switching circuits or switch circuits.

In the calibration mode, the voltage source VDC of the final test machine FTM may supply the common voltage to the current-voltage converters CV1 to CVn of the current sensing circuits CSU1 to CSUn. As a result, calibration currents IDC1 to IDCn each having the preset current value flow to the final test machine FTM respectively from the current-voltage converters CV1 to CVn.

In the calibration mode, the multiplexer MUX allows the calibration currents IDC1 to IDCn each having the preset current value to flow sequentially to the final test machine FTM respectively from the current-voltage converters CV1 to CVn. A current outputted by the current source IDC shown in FIG. 3 has the preset current value. In this way, the final test machine FTM can ensure that each of the calibration currents IDC1 to IDCn respectively outputted by the current-voltage converters CV1 to CVn has the preset current value.

The voltage sensing components VS1 to VSn are respectively disposed in the current sensing circuits CSU1 to CSUn, and the current-voltage converters CV1 to CVn are respectively disposed in the current sensing circuits CSU1 to CSUn. In the calibration mode, the voltage sensing components VS1 to VSn are configured to respectively sense the current-voltage converters CV1 to CVn to obtain a voltage difference between an input terminal and an output terminal of the sensed current-voltage converters CV1 to CVn. The voltage sensing components VS1 to VSn respectively output the sensed calibration data TDATA1 to TDATAn according to the obtained voltage differences.

In the calibration mode, when the calibration currents IDC1 to IDCn each having the preset current value sequentially flow to the final test machine FTM respectively from the current-voltage converters CV1 to CVn, the final test machine FTM sequentially records the sensed calibration data TDATA1 to TDATAn respectively outputted from the voltage sensing components VS1 to VSn.

After the calibration mode is performed in FIG. 3 as described above, the measurement mode is performed in FIG. 4 as described in the following.

As shown in FIG. 2, only the current sensing circuit CSU1 is disposed in the circuit measuring device of the first embodiment and configured to detect only one tested current from the tested circuit DUT. On the other hand, as shown in FIG. 4, the plurality of current sensing circuits CSU1 to CSUn are disposed in the circuit measuring device of the second embodiment, and configured to respectively detect a plurality of tested currents from the same tested circuit DUT. In practice, the current sensing circuits CSU1 to CSUn may be configured to respectively detect a plurality of tested currents from different tested circuits.

As shown in FIG. 4, in the measurement mode, a plurality of output terminals ICH1 to ICHn of the tested circuit DUT respectively output the plurality of tested currents to the current-voltage converters CV1 to CVn.

The current-voltage converters CV1 to CVn respectively convert the plurality of tested currents into a plurality of tested voltages. In the measurement mode, the voltage sensing components VS1 to VSn respectively sense voltages between the input terminals and the output terminals of the current-voltage converters CV1 to CVn to output actual sensed data MDATA1 to MDATAn.

In the measurement mode, the final test machine FTM calculates differences between the actual sensed data MDATA1 to MDATAn and the sensed calibration data TDATA1 to TDATAn corresponding thereto. The differences include the difference between the actual sensed data MDATA1 and the sensed calibration data TDATA1, and the difference between the actual sensed data MDATAn and the sensed calibration data TDATAn.

In the measurement mode, when the final test machine FTM determines that each of the differences is larger than the difference threshold such as zero, the pins SCL and SDA of the final test machine FTM output the adjusting signal to the tested circuit DUT. The tested circuit DUT is instructed to adjust the tested current by the adjusting signal.

As described above, only one tested current flows through each of the current-voltage converters CV1 to CVn to the final test machine FTM, but the present disclosure is not limited thereto. In practice, in the calibration mode, a first calibration current having a first preset current value and a second calibration current having a second preset current value may flow through each of the current-voltage converters CV1 to CVn to the final test machine FTM at different times.

In the calibration mode, each of the current-voltage converters CV1 to CVn converts the first calibration current into a first calibration voltage and outputs the first calibration voltage. At this time, the voltage sensing components VS1 to VSn respectively sense the current-voltage converters CV1 to CVn to obtain the voltage between the input terminal and the output terminal of the sensed current-voltage converters CV1 to CVn to output first sensed calibration data.

In the calibration mode, each of the current-voltage converters CV1 to CVn converts the second calibration current into a second calibration voltage and outputs the second calibration voltage. At this time, the voltage sensing components VS1 to VSn respectively sense the current-voltage converters CV1 to CVn to obtain the voltage between the input terminal and the output terminal of the sensed current-voltage converters CV1 to CVn to output second sensed calibration data.

In the calibration mode, the final test machine FTM may generate a calibration equation according to the first calibration current, the first sensed calibration data, the second calibration current and the second sensed calibration data. Then, the final test machine FTM calculates the sensed calibration data generated when each of the current-voltage converters CV1 to CVn receives the calibration current having a target current value.

The calibration equation may be represented by:

$$DX = \alpha \times IX + \beta,$$

wherein, DX represents the sensed calibration data, α represents a gain, IX represents the calibration current having the target current value, and β represents an offset value.

In the measurement mode, the final test machine FTM compares the sensed calibration data with the actual sensed data to determine whether or not the tested current outputted by the tested circuit DUT has the target current value.

Alternatively, the final test machine FTM may calculate a first sensed calibration equation and a second sensed calibration equation, and then calculate the calibration equation according to the first sensed calibration equation and the second sensed calibration equation.

In detail, the final test machine FTM generates the first sensed calibration equation according to the first calibration current and the first sensed calibration data. The first sensed calibration equation is represented by:

$$D0 = \alpha \times I0 + \beta,$$

wherein D0 represents the sensed calibration data generated when each of the current-voltage converters CV1 to CVn outputs the first calibration current, α represents the gain, β represents the offset value, and I0 represents the first calibration current.

Then, the final test machine FTM generates the second sensed calibration equation according to the second calibration current and the second sensed calibration data. The second sensed calibration equation is represented by:

$$D1 = \alpha \times I1 + \beta,$$

wherein D1 represents the sensed calibration data generated when each of the current-voltage converters CV1 to CVn outputs the second calibration current, α represents the gain, β represents the offset value, and I1 represents the second calibration current.

Finally, the final test machine FTM performs an arithmetic operation on the first sensed calibration equation and the second sensed calibration equation to generate the calibration equation.

Figure 5:
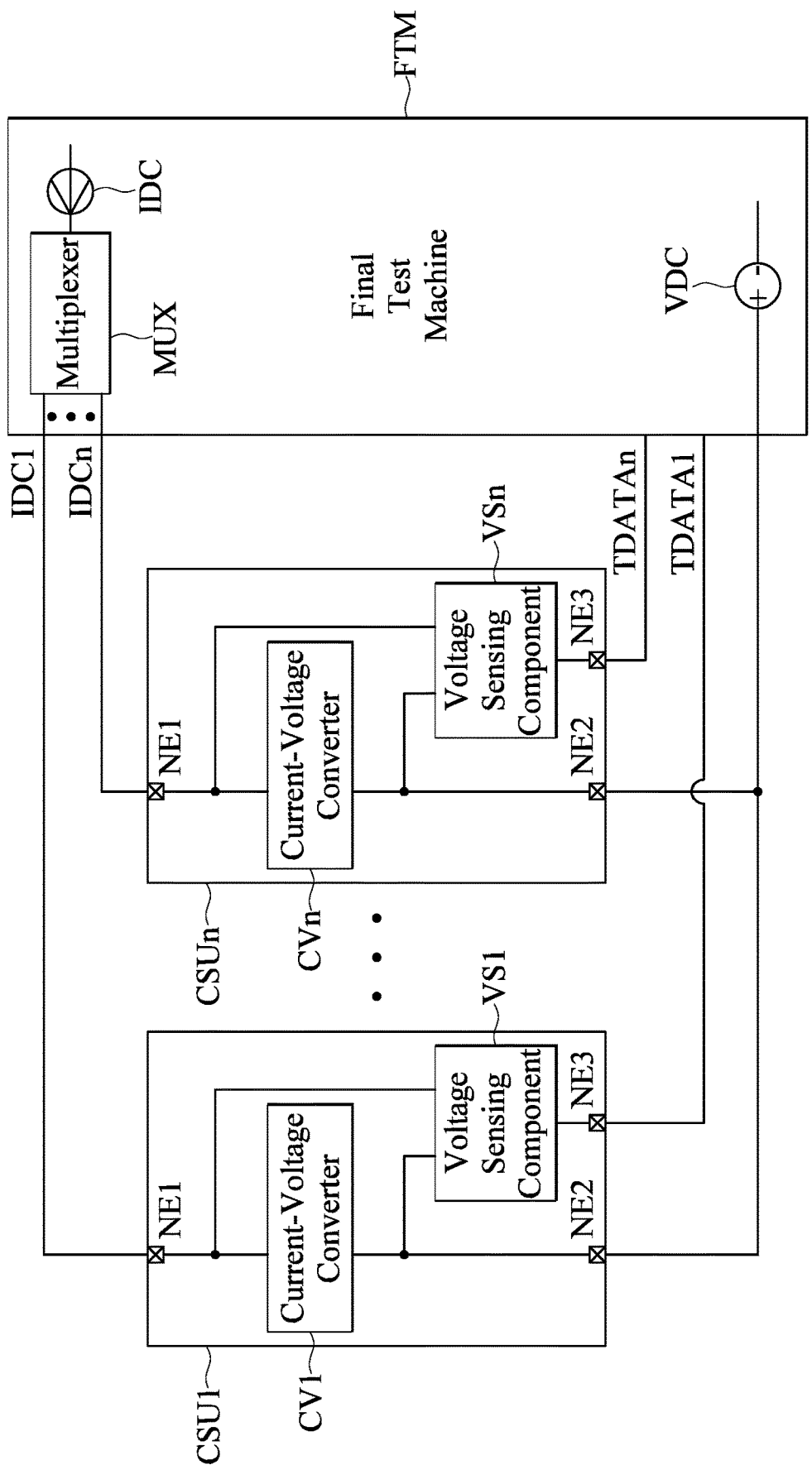
FIG. 5 is a circuit layout diagram of a circuit measuring device in a calibration mode according to a third embodiment of the present disclosure.

Reference is made to FIG. 5, which is a circuit layout diagram of a circuit measuring device in a calibration mode according to a third embodiment of the present disclosure.

A difference between FIG. 5 of the third embodiment and FIG. 3 of the second embodiment resides in circuit layouts of the voltage source VDC and the multiplexer MUX.

As shown in FIG. 5, the voltage source VDC provided by the final test machine FTM is connected to the second node NE2 of each of the current sensing circuits CSU1 to CSUn. The multiplexer MUX is connected to the first node NE1 of each of the current sensing circuits CSU1 to CSUn.

Therefore, the calibration currents IDC1 to IDCn shown in FIG. 3 flow in a direction opposite to a flow direction of the calibration currents IDC1 to IDCn shown in FIG. 5. In detail, the calibration currents IDC1 to IDCn shown in FIG. 3 flow from the first node NE1 to the second node NE2, but the calibration currents IDC1 to IDCn shown in FIG. 5 flow from the second node NE2 to the first node NE1. However, the circuit measuring devices shown in FIG. 3 and FIG. 5 perform the same operations, the same descriptions of which are not repeated here.

Figure 6:
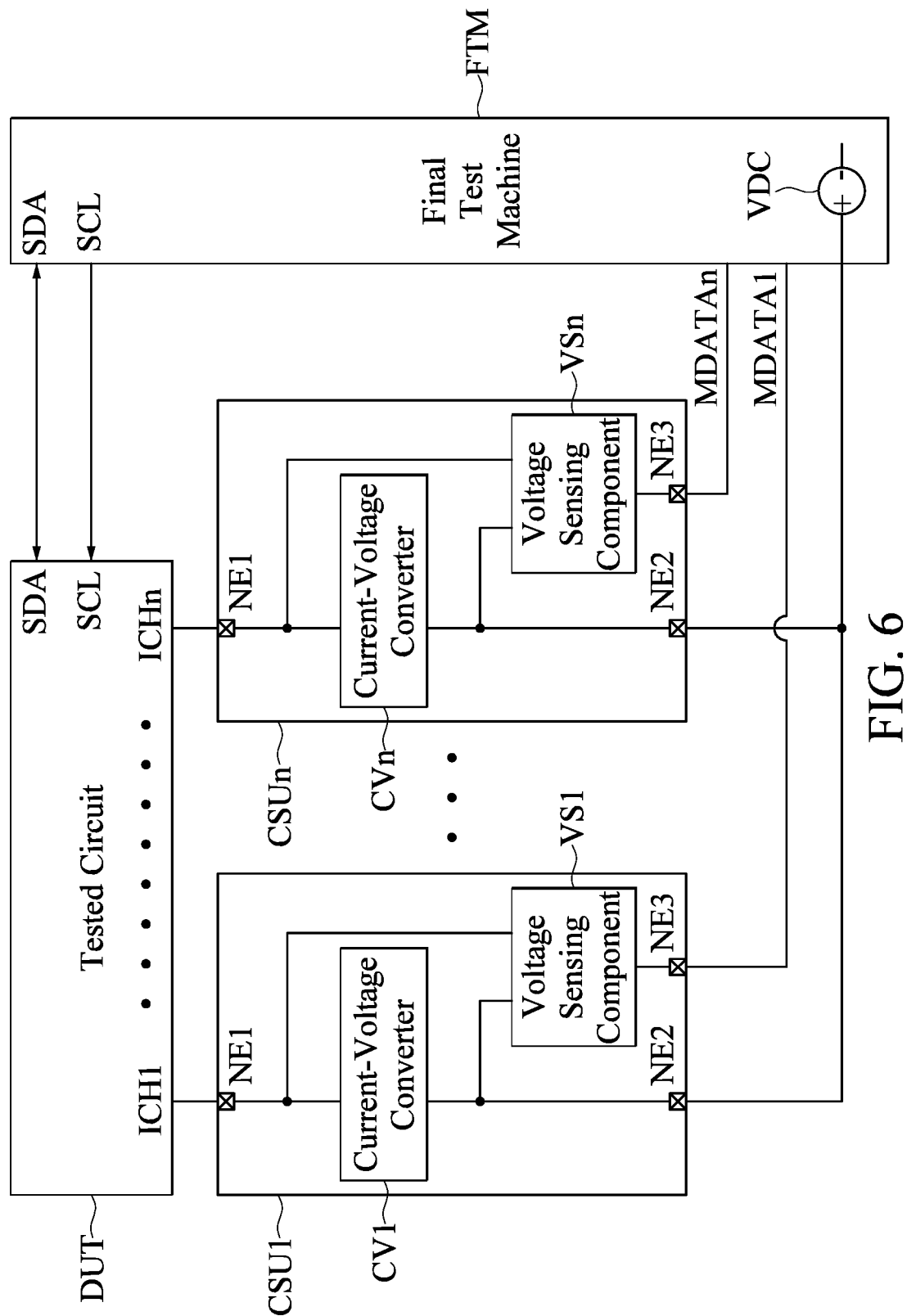
FIG. 6 is a circuit layout diagram of the circuit measuring device in a measurement mode according to the third embodiment of the present disclosure.

Reference is made to FIG. 6, which is a circuit layout diagram of the circuit measuring device in a measurement mode according to the third embodiment of the present disclosure.

A difference between FIG. 6 of the third embodiment and FIG. 4 of the second embodiment resides in circuit layouts of the voltage source VDC and the tested circuit DUT.

As shown in FIG. 6, the voltage source VDC provided by the final test machine FTM is connected to the second node NE2 of each of the current sensing circuits CSU1 to CSUn. The output terminals ICH1 to ICHn of the tested circuit DUT are respectively connected to the first nodes NE1 of the current sensing circuits CSU1 to CSUn. Therefore, the tested currents flow from the tested circuit DUT respectively through the first nodes NE1 of the current sensing circuits CSU1 to CSUn to the current-voltage converters CV1 to CVn.

Figure 7:
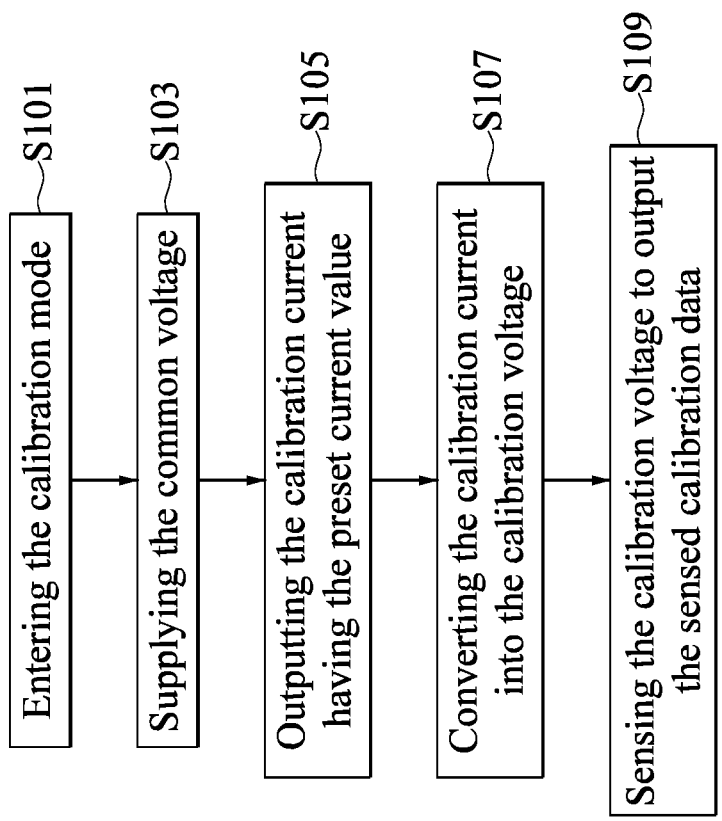
FIG. 7 is a flowchart diagram of calibration processes of a circuit measuring method according to a fourth embodiment of the present disclosure.
Figure 8:
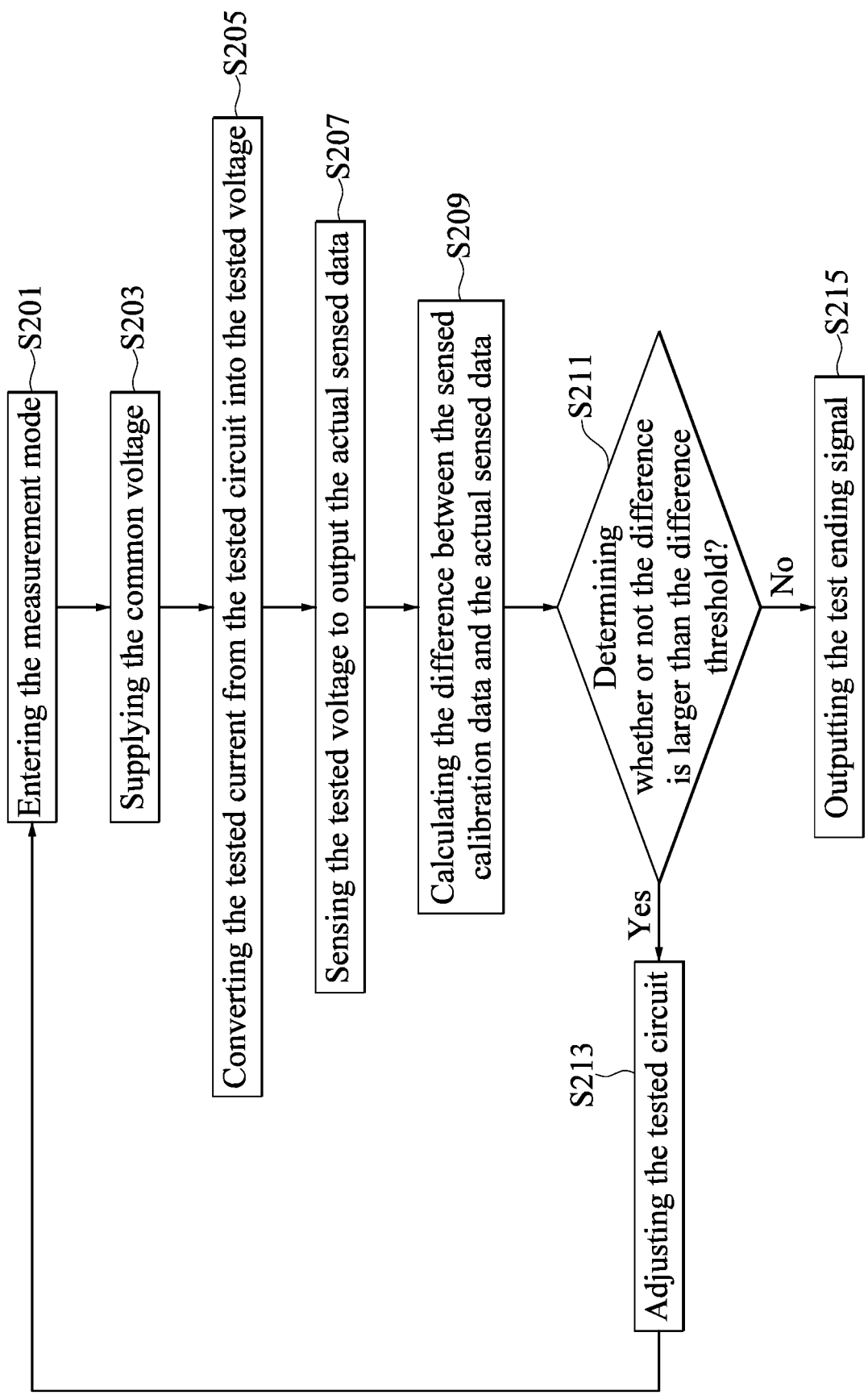
FIG. 8 is a flowchart diagram of measurement processes of the circuit measuring method according to a fourth embodiment of the present disclosure.

Reference is made to FIGS. 7 and 8, wherein FIG. 7 is a flowchart diagram of calibration processes of a circuit measuring method according to a fourth embodiment of the present disclosure, and FIG. 8 is a flowchart diagram of measurement processes of the circuit measuring method according to a fourth embodiment of the present disclosure.

In the embodiment, the circuit measuring method includes the calibration processes of steps S101 to S109 shown in FIG. 7 and the measurement processes of steps S201 to S215 shown in FIG. 8. The steps S101 to S109 and S201 to S215 may be performed by the circuit measuring device of the second or third embodiment.

First, step S101 is performed. In step S101, the calibration mode is entered into.

In the calibration mode, the calibration processes of steps S103 to S109 are performed.

In step S103, the voltage source VDC provided by the final test machine FTM supplies the common voltage to each of the current sensing circuits CSU1 to CSUn.

In step S105, the current-voltage converters CV1 to CVn respectively output the calibration currents IDC1 to IDCn each having a preset current value.

In step S107, the current-voltage converters CV1 to CVn respectively convert the calibration currents IDC1 to IDCn into the calibration voltages.

In step S109, the voltage sensing components VS1 to VSn respectively sense the calibration voltages (or the voltages between the input terminals and the output terminals of the current-voltage converters CV1 to CVn) to respectively output the sensed calibration data TDATA1 to TDATAn.

Then, the measurement mode is entered into in step S201. In the measurement mode, the measurement processes of steps S203 to S205 are performed.

In step S203, the voltage source VDC provided by the final test machine FTM supplies the common voltage to each of the current sensing circuits CSU1 to CSUn.

In step S205, the current-voltage converters CV1 to CVn respectively receive the tested currents from the tested circuit DUT. Then, the current-voltage converters CV1 to CVn respectively convert the tested currents into the tested voltages, and respectively output the tested voltages.

In step S207, the voltage sensing components VS1 to VSn respectively sense the tested voltages that are the voltage differences between the input terminals and the output terminals of the current-voltage converters CV1 to CVn to output the actual sensed data MDATA1 to MDATAn.

In step S209, the final test machine FTM calculates the differences between the actual sensed data MDATA1 to MDATAn and the sensed calibration data TDATA1 to TDATAn outputted in step S109.

In step S211, the final test machine FTM determines whether or not each of the differences calculated in step S209 is larger than the difference threshold such as zero. If the final test machine FTM determines that the difference is larger than the difference threshold, step S213 is performed. If the final test machine FTM determines that the difference is not larger than the difference threshold, step S215 is performed.

In step S213, the final test machine FTM outputs the adjusting signal to the tested circuit DUT. The tested circuit DUT is instructed to adjust the tested currents by the adjusting signal. Then, step S201 is performed again. In step S201, the measurement mode is entered into again. Then, the measurement processes are performed on the adjusted tested currents.

In step S215, the final test machine FTM outputs the test ending signal for indicating that each of the tested currents outputted by the tested circuit DUT has the preset or target current value.

In summary, the present disclosure provides the circuit measuring device and method, which have the following advantages:
1. the current sensing circuits synchronously test the tested circuit, thereby effectively reducing a time required for measuring the tested circuit;
2. the current sensing circuits are disposed such that hardware equipment requirements of the final test machine are reduced, for example, a large number of voltage sources and current sources do not need to be disposed; and
3. the circuit measuring device accurately determines whether or not the tested current outputted by the tested circuit is equal to the target current, the tested circuit being adjusted when the tested current is not equal to the target current.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A circuit measuring device, comprising:
   a final test machine configured to provide a voltage source for supplying a common voltage in a calibration mode and a measurement mode, and provide a current source in the calibration mode; and
   one or more current sensing circuits connected to the final test machine, and each of the current sensing circuits including:

a current-voltage converter connected to the current source in the calibration mode and connected to a tested circuit in the measurement mode, wherein the current-voltage converter is connected to the voltage source and configured to receive the common voltage from the voltage source in the calibration mode and the measurement mode, such that a calibration current having a preset current value flows from the current-voltage converter to the final test machine as an output current of the current source in the calibration mode, the current-voltage converter converts the calibration current into a calibration voltage and outputs the calibration voltage in the calibration mode, and the current-voltage converter receives a tested current from the tested circuit and converts the tested current into a tested voltage in the measurement mode; and a voltage sensing circuit connected to the current-voltage converter, wherein the voltage sensing circuit is configured to sense a voltage between an input terminal of the current-voltage converter and an output terminal of the current-voltage converter to output sensed calibration data in the calibration mode, and the voltage sensing circuit is configured to sense the voltage between the input terminal of the current-voltage converter and the output terminal of the current-voltage converter to output actual sensed data in the measurement mode;

wherein, in the measurement mode, the final test machine is configured to calculate a difference between the sensed calibration data and the actual sensed data;

wherein, in the measurement mode, when the final test machine determines that the difference is higher than a difference threshold, the final test machine outputs an adjusting signal for instructing the tested circuit to adjust the tested current.

2. The circuit measuring device according to claim 1, wherein the number of the current sensing circuits is more than one, each of the current sensing circuits includes the current-voltage converter and the voltage sensing circuit, and the current sensing circuits are respectively configured to convert a plurality of tested currents outputted by the tested circuit into a plurality of tested voltages in the measurement mode.

3. The circuit measuring device according to claim 2, wherein the final test machine provides a switching circuit connected to the current sensing circuits, and in the calibration mode, the switching circuit sequentially switches the current sensing circuits such that the current sensing circuits are sequentially connected to the final test machine, and allows a plurality of calibration currents that are respectively outputted by the current sensing circuits to flow to the final test machine respectively during different time intervals.

4. The circuit measuring device according to claim 3, wherein the switching circuit includes a multiplexer.

5. The circuit measuring device according to claim 1, wherein the calibration current outputted by the current-voltage converter includes a first calibration current and a second calibration current;

wherein, when the current-voltage converter converts the first calibration current into a first calibration voltage and outputs the first calibration voltage, the voltage sensing circuit generates first sensed calibration data according to the voltage between the input terminal and the output terminal of the current-voltage converter;

wherein, when the current-voltage converter converts the second calibration current into a second calibration voltage and outputs the second calibration voltage, the voltage sensing circuit generates second sensed calibration data according to the voltage between the input terminal and the output terminal of the current-voltage converter;

wherein, in the calibration mode, the final test machine is configured to generate a calibration equation according to the first calibration current, the first sensed calibration data, the second calibration current and the second sensed calibration data, and calculate the sensed calibration data when the current sensing circuit receives the calibration current having a target current value based on calibration equation;

wherein, in the measurement mode, the final test machine is configured to compare the sensed calibration data with the actual sensed data to determine whether the tested circuit outputs the tested current having the target current value.

6. The circuit measuring device according to claim 5, wherein the calibration equation is represented by:

$$DX=\alpha \times IX+\beta,$$

wherein DX represents the sensed calibration data, IX represents the calibration current having the target current value, $\alpha$ represents a gain, and $\beta$ represents an offset value.

7. The circuit measuring device according to claim 5, wherein the final test machine is configured to generate a first sensed calibration equation according to the first calibration current and the first sensed calibration data, generate a second sensed calibration equation according to the second calibration current and the second sensed calibration data, and perform an arithmetic operation on the first sensed calibration equation and the second sensed calibration equation to generate the calibration equation.

8. The circuit measuring device according to claim 7, wherein the first sensed calibration equation is represented by:

$$D0=\times \times I0+\beta,$$

wherein D0 represents the first sensed calibration data generated when each of the current voltage converters CV1 to CVn the current-voltage converter outputs the first calibration current, $\alpha$ represents a gain, $\beta$ represents an offset value, and I0 represents the first calibration current;

wherein the second sensed calibration equation is represented by:

$$D1=\alpha \times I1+\beta,$$

wherein D1 represents the second sensed calibration data generated when each of the current voltage converters CV1 to CVn the current-voltage converter outputs the second calibration current, $\alpha$ represents the gain, $\beta$ represents the offset value, and I1 represents the second calibration current;

wherein the calibration equation is represented by:

$$DX=\alpha \times IX+\beta,$$

wherein DX represents the sensed calibration data, IX represents the calibration current having the target current value, $\alpha$ represents the gain, and $\beta$ represents the offset value.

9. A circuit measuring method, comprising the following steps:

in a calibration mode, supplying a common voltage;

in the calibration mode, generating a calibration current having a preset current value;

in the calibration mode, converting the calibration current into a calibration voltage;

in the calibration mode, sensing the calibration voltage to output sensed calibration data;

in a measurement mode, supplying the common voltage;

in the measurement mode, converting a tested current from a tested circuit into a tested voltage;

in the measurement mode, sensing the tested voltage to output actual sensed data;

in the measurement mode, calculating a difference between the sensed calibration data and the actual sensed data; and in the measurement mode, determining whether or not the difference between the sensed calibration data and the actual sensed data is higher than a difference threshold, in response to determining that the difference is higher than the difference threshold, outputting an adjusting signal for instructing the tested circuit to adjust the tested current, in response to determining that the difference is not higher than the difference threshold, outputting a test ending signal.

10. The circuit measuring method according to claim 9, further comprising the following steps:

in the measurement mode, converting a plurality of tested currents outputted by the tested circuit respectively into a plurality of tested voltages; and in the measurement mode, sensing the tested voltages to output the actual sensed data.

11. The circuit measuring method according to claim 9, further comprising the following steps:

in the calibration mode, receiving the common voltage and generating a first calibration current according to the common voltage;

in the calibration mode, converting the first calibration current into a first calibration voltage;

in the calibration mode, sensing the first calibration voltage to output first sensed calibration data;

in the calibration mode, receiving the common voltage and generating a second calibration current according to the common voltage;

in the calibration mode, converting the second calibration current into a second calibration voltage;

in the calibration mode, sensing the second calibration voltage to output second sensed calibration data;

in the calibration mode, generating a calibration equation according to the first calibration current, the first sensed calibration data, the second calibration current and the second sensed calibration data;

in the calibration mode, calculating the sensed calibration data when the calibration current having a target current value is generated, based on the calibration equation; and in the measurement mode, comparing the sensed calibration data with the actual sensed data to determine whether or not the tested circuit outputs the tested current having the target current value, in response to determining that the tested circuit outputs the tested current having the target current value, outputting the test ending signal, in response to determining that the tested circuit does not output the tested current having the target current value, outputting the adjusting signal.

12. The circuit measuring method according to claim 11, further comprising the following step:

in the calibration mode, generating the calibration equation according to the first calibration current, the first sensed calibration data, the second calibration current, the second sensed calibration data, a gain and an offset value, wherein the calibration equation is represented by:

$$DX = \alpha \times IX + \beta,$$

wherein DX represents the sensed calibration data, IX represents the calibration current having the target current value, $\alpha$ represents the gain, and $\beta$ represents the offset value.

13. The circuit measuring method according to claim 11, further comprising the following steps:

in the calibration mode, generating a first sensed calibration equation according to the first calibration current and the first sensed calibration data;

in the calibration mode, generating a second sensed calibration equation according to the second calibration current and the second sensed calibration data; and in the calibration mode, performing an arithmetic operation on the first sensed calibration equation and the second sensed calibration equation to generate the calibration equation.

14. The circuit measuring method according to claim 13, further comprising the following steps:

in the calibration mode, based on the first calibration current and the first sensed calibration data, generating the first sensed calibration equation represented by:

$$D0 = \alpha \times I0 + \beta,$$

wherein D0 represents the first sensed calibration data generated when each of current voltage converters CV1 to CVn outputs the first calibration current, $\alpha$ represents a gain, $\beta$ represents an offset value, and I0 represents the first calibration current;

in the calibration mode, based on the second calibration current and the second sensed calibration data, generating the second sensed calibration equation represented by:

$$D1 = \alpha \times I1 + \beta,$$

wherein D1 represents the second sensed calibration data generated when each of the current voltage converters CV1 to CVn outputs the second calibration current, $\alpha$ represents the gain, $\beta$ represents the offset value, and I1 represents the second calibration current; and in the calibration mode, performing the arithmetic operation on the first sensed calibration equation and the second sensed calibration equation to generate the calibration equation represented by:

$$DX = \alpha \times IX + \beta,$$

wherein DX represents the sensed calibration data, IX represents the calibration current having the target current value, $\alpha$ represents the gain, and $\beta$ represents the offset value.

* * * * *